United States Patent [19]

Bonora

[11] 3,998,598
[45] Dec. 21, 1976

[54] AUTOMATIC DIAMETER CONTROL FOR CRYSTAL GROWING FACILITIES

[75] Inventor: Anthony C. Bonora, Palo Alto, Calif.

[73] Assignee: Semimetals, Inc., Mountain View, Calif.

[22] Filed: Feb. 7, 1974

[21] Appl. No.: 440,592

Related U.S. Application Data

[63] Continuation of Ser. No. 418,392, Nov. 23, 1973, abandoned.

[52] U.S. Cl. .................. 23/273 SP; 156/601; 156/617 R
[51] Int. Cl.$^2$ .................. B01D 9/00; B01J 17/18
[58] Field of Search .......... 23/273 SP, 301 SP; 156/617, 601

[56] References Cited
UNITED STATES PATENTS

| | | | |
|---|---|---|---|
| 3,291,650 | 12/1966 | Dohmen et al. | 23/301 SP |
| 3,493,770 | 2/1970 | Dessauer et al. | 23/273 SP |
| 3,499,736 | 3/1970 | Zwaneburg | 23/273 SP |
| 3,621,213 | 11/1971 | Jen et al. | 23/301 SP |
| 3,692,499 | 9/1972 | Andrychuk | 23/301 SP |
| 3,740,563 | 6/1973 | Reichard | 23/273 SP |

Primary Examiner—Wilbur L. Bascomb, Jr.
Assistant Examiner—Barry I. Hollander

[57] ABSTRACT

In the Czochralsky method of crystal growing, a crystal or ingot is pulled from a melt. The control of the present invention will find particular application in the Czochralsky pulling of large crystals such as those of silicon which typically are 40 inches long and 3 inches in diameter. The control assures a uniform diameter over the entire length of the crystal as well as avoids the formation of "flats" on the surface of the crystal. This is achieved by optically sighting the crystal melt interface and adjusting the sighting for variations in melt level.

11 Claims, 6 Drawing Figures

AUTOMATIC DIAMETER CONTROL FOR CRYSTAL GROWING FACILITIES

This application is a continuation of my earlier application having the same title, filed on Nov. 23, 1973 and bearing Ser. No. 418,392, now abandoned.

The invention relates generally to controls for crystal growing facilities, and particularly to controls to improve the quality and uniformity of the crystals.

Electrical grade silicon ingots or crystals have been prepared for many years by the Czochralsky method. In that method a crucible is charged with pure silicon and heated until the silicon melts. A seed, i.e. tiny crystal, of silicon is dipped into the molten charge and slowly withdrawn, or "pulled". As the seed is withdrawn, molten silicon adhering to it freezes, thus forming a solid large crystal or ingot. If properly started and pulled the ingot is a single crystal, and of the same crystallographic orientation as the seed. A typical size of an ingot is 40 inches in length and 3 inches in diameter.

In pulling crystals a number of techniques have been developed for improving the crystallographic and dimensional uniformity of the ingot. These include: rotating the crystal relative to the melt and varying the pull rate and/or the temperature.

Two problems in the present art of crystal pulling are (1) the occurrence of flats and (2) non uniform diameter over the length of the crystal. A flat is a condition in which a flat portion appears on the otherwise round surface of the crystal. The larger the crystal diameter the more pronounced are the flats. The presence of flats diminishes the value of the crystal. The reason for the formation of flats is still somewhat of a mystery.

Crystal diameter is controlled in certain commercially available machines by having an optical pyrometer sight the crystal-to-melt interface. Since the light emitted at the interface is greater in intensity than that emitted from the melt and less than that from the crystal, the pyrometer can provide an accurate signal when the crystal gets too large or gets too small, because a change in crystal diameter will cause the pyrometer to sight the relatively dull melt or relatively brighter crystal rather than the interface. This signal activates the pull rate mechanism and/or a temperature control to decrease or increase the speed of pull and/or the melt temperature, thereby to tend to keep constant the diameter of the crystal being pulled. It will be appreciated, however, that as the crystal is being pulled from the melt, the level of the melt falls in the crucible. Thus the pyrometer aligned at the interface of a full crucible will measure one diameter, and will focus on a much narrower diameter when the crucible is almost empty. This type of pyrometer control produces crystals that narrow as the melt level falls.

To avoid this tapered diameter crystal growers were built in which the crucible and the crystal puller were slaved together so that the crucible would rise (or the heater would fall) at the same rate at which the melt level was falling, with the result that the melt level would be constant relative to the fixed pyrometer. It was thought that this would also avoid the formation of flats. It was found, however, that while the formation of flats can in fact be greatly minimized by controlling the rate of crucible lift (or heater fall) as the crystal is being pulled, in fact the rate of crucible lift (or heater fall) for flat prevention is substantially different from that required to maintain a constant melt level. Hence to the prior art simultaneous achievement of these two desiderata-uniform diameter and few or no flats-seemed impossible of achievement.

The proper rate of crucible lift to control flats results in a variable melt level, usually falling, and this produces a typical diameter error on the order of 0.25 to 0.5 inches in a 40-inch long 2-inch diameter crystal. it is desirable in a crystal to keep the diameter error to ±0.04 inches.

The present invention enables one to attain both of these desiderata-minimum flats and uniform diameter-even though previously they were considered to be mutually exclusive "trade-offs". For example, with the apparatus of the present invention I have been able to regularly grow 40-inch long crystals, 3 inches in diameter to within ±0.04 inches, and even as fine as ±0.01 inches, with virtually no flats.

One purpose of the present invention is to provide a control for use in a crystal growing facility, to grow a crystal substantially without flats and with a uniform diameter over the entire length of the crystal.

According to one embodiment of the invention there is provided a control for a crystal pulling facility in which a crystal is pulled from a melt in a crucible. The control includes regulation of the pull speed and temperature of the melt, as well as a slaved relationship between raising the crucible or lowering the heater in accordance with the pull speed. A pyrometer is aligned with the liquid solid interface between the crystal and the melt to define a predetermined diameter of the crystal, and provides a signal when the interface is out of alignment. In response to this signal the temperature and/or pull speed is regulated so as to maintain the interface within the alignment. The alignment of the pyrometer is adjusted to compensate for changes in melt level, so that the pyrometer is always aimed at the desired interface position to produce crystals of uniform diameter even though the melt level does change. This adjustment is effected in terms of the crystal pull speed, modified in accordance with the diameter of the crystal, the inside diameter of the crucible, and the lift rate of the crucible or the drop rate of the heater.

To the accomplishment of the above, and to such other objects as may appear, the present invention relates to a crystal pulling control system as defined in the following claims and described in this specification, taken together with the accompanying drawings, in which:

Figure 1:
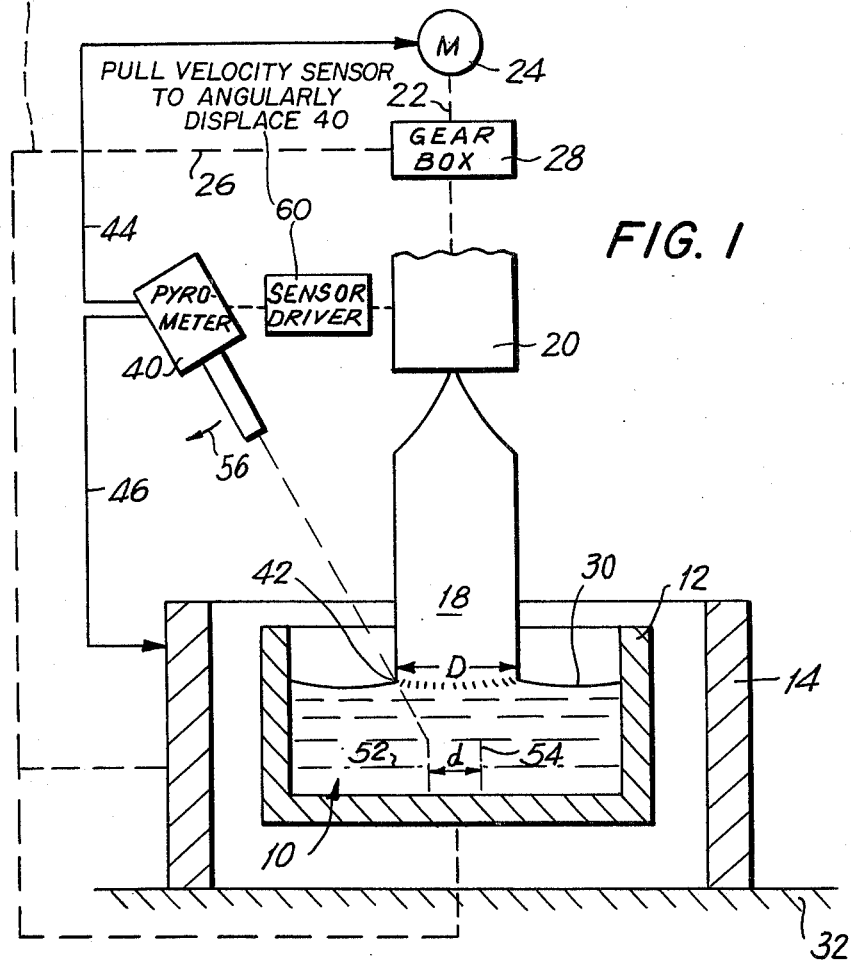
FIG. 1 is a schematic drawing partially in cross section and partially in block form, showing a crystal puller and the control of the present invention.

Referring now to the drawing of FIG. 1 in which there is schematically shown, partially in cross section and partially in block form, a crystal puller and the control of the present invention, a charge 10 of silicon, for example, is placed inside a crucible 12 which is surrounded by a heater 14. The heater causes the charge 10 to melt. A seed of silicon of proper orientation has been dipped into the molten charge or melt 10 and has been pulled or drawn up to form the beginning of a crystal or ingot 18. The seed is mounted in a puller mechanism only a portion of which is shown in block form by legend 20. A mechanical drive shown by dotted lines 22 raises or pulls the puller 20 and ingot 18 from the melt 10.

Suitable motive means shown here as a motor 24 is connected to the mechanical drive 22 to raise the puller. The crucible 12, or the heater 14, were also mechanically raised or lowered respectively during the crystal pulling. This is shown schematically by a linkage 26 connected to the motor 24. A slave mechanism 28 (i.e. gear box) connected between the motor 24 and the mechanical drive 26 slaves the raising of the crucible or the lowering of the heater to the pulling of the crystal. This type of equipment is well known to those skilled in the art. See for example U.S. Pat. No. 3,337,303 assigned to the same assignee as the present application.

Several prior art machines have slaved the raising of the crucible to the crystal pull rate so that the melt level 30 is held constant relative to a reference level shown schematically as 32.

An infrared pyrometer 40 is used to control the diameter of the crystal. The pyrometer is sighted onto the optimum position of the crystal-to-liquid interface 42. Assuming for the moment that the melt level 30 is constant, as the crystal decreases in diameter the pyrometer sights the liquid 10 and a smaller signal is produced in the pyrometer; as the crystal becomes too large in diameter it sights the hotter meniscus and crystal 18 and a larger electric signal is produced in the pyrometer. These signals are shown schematically as being applied on line 44 to the motive means 24 to control the rate of the puller and on line 46 to control the temperature of the heater 14. Temperature and pull rate are the two most commonly adjusted variables to regulate the diameter of the crystal. They may be adjusted alternatively or cooperatively. Details are not shown, as those skilled in the art are familiar with such controls and any convenient or conventional control may be used.

Figure 2:
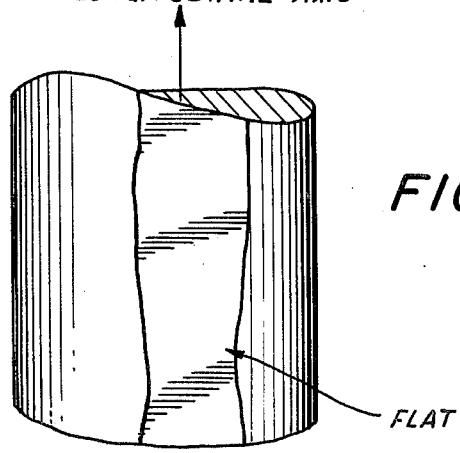
FIG. 2 is a perspective view of a section of a silicon crystal having undesirable flats.

I have discovered that it is not advisable to slave the crucible lift rate so that the melt level is constant, because this fosters the formation of flats i.e. flat areas on the outer surface of the crystal, as shown (in perspective) in FIG. 2. Further, I have discovered that the optimum lift rate for the crucible for the avoidance of flats produces in the case of silicon a falling melt level relative to the reference level 32.

As the melt level drops for example to level 52 (shown in phantom in FIG. 1) then the pyrometer will not focus on the crystal-to-liquid interface of a crystal of a diameter D (as the diameter would be when the level is at 30) but of a lesser diameter d of the crystal shown in phantom as 54 [It should be appreciated that the drawing of FIG. 1 is schematic and not to scale 1.].

To avoid this change in diameter a control is constructed in this invention which adjusts the pyrometer sighting to the true level of the melt, so as always to sight a crystal of the predetermined diameter D.

This is shown schematically in FIG. 1 as a sensor and driver 60 connected to the puller 20 to sense the velocity of the puller 20 and in accordance therewith to angularly displace the pyrometer so that its alignment faithfully follows the actual melt level in the crucible. For example, in FIG. 1, should the melt level drop to 52, then the pyrometer would be clockwise rotated as shown by arrow 56 to align an interface of diameter D.

Figure 3:
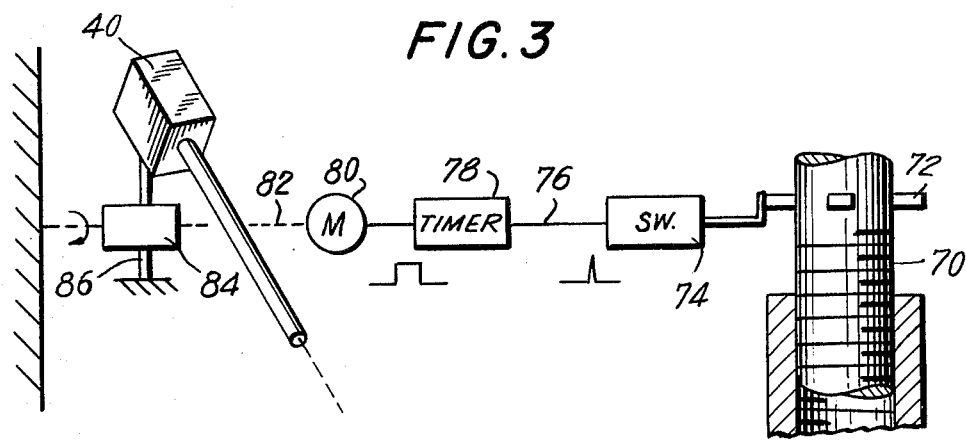
FIG. 3 is a schematic drawing partially in block form and partially schematic of one embodiment of the present invention.

FIG. 3 is a schematic partially block, partially perspective drawing illustrating the control of one embodiment of this invention. The crystal puller includes a rotating member 70 which pulls the crystal upwards. Four vanes or wings 72 protrude from the rotating member. A switch 74 having an activation arm to engage the vanes 74 is positioned adjacent to the rotating member. Each time a vane 74 engages the switch, a pulse is produced at the output of the switch on a line 76. A timer 78 is connected to receive the pulses and produces an output signal of predetermined energy content. An example might be helpful here. The rotating member 70 is revolving at about one revolution every 4 minutes. Thus, a pulse is produced by the switch once every minute. The timer will stretch this pulse and produce for each input pulse an output signal such as a d.c. pulse of approximately 10 seconds duration. This output signal is applied to a motor 80 which is activated thereby. The mechanical output of the motor, shown by a linkage 82, is connected to a gear 84 mounted on a pedestal 86 which supports the pyrometer 40. For each activation of the motor 80 and gear 84 by each output signal pulse the pyrometer 40 is slightly angularly displaced so as to align itself at a new point in the melt-crystal interface. A typical displacement for one pulse is 1/400 of a degree.

The correct amount of displacement of the alignment of the pyrometer per unit time is primarily a function of the velocity of the crystal puller; the greater the pull velocity, the greater the frequency of the output signal pulses. This can be expressed as $$V_m = C V_x$$

when
$V_m$ = velocity of the melt level
$V_x$ = pull rate of the crystal, and
$C$ = a multiplying factor dependent on the ratio of the diameters of the crystal and crucible and on the ratio of pull speed to crucible lift speed.

$C$ is a factor determining, in the embodiment here described, the length of each output signal pulse, and hence the amount of alignment displacement per pulse. It may, in a typical instance, be related to the ratio of the radius of the crystal being pulled squared to the radius of the crucible inside diameter squared as well as to the ratio of the crystal pull velocity to the crucible lift velocity.

This accurate relationship may be expressed mathematically as follows:

$$V_m = k \left( \frac{r_x}{r_c} \right)^2 (V_c - V_x) + V_c$$

wherein
$V_m$ = velocity of the melt level
$V_x$ = pull rate of the crystal
$r_x$ = the radius of the crystal being pulled
$r_c$ = the internal radius of the crucible
$V_c$ = the velocity lift of the crucible or the velocity of fall of the heater
$k$ = a factor In this equation to determine the correct alignment position of the pyrometer one integrates the instantaneous velocities in the above equation over the time elapsed. It should be noted that in practice the velocities are generally not constant as pullrate is constantly varied to control the diameter of the crystal. Certain outer limits—too fast and too slow—for crystal pulling restrict the permissible velocities to within a given range.

In the above equation we have assumed that rc, the internal radius of the crucible, is constant. If this is not true then the instantaneous radius of the crucible at the melt level is used. The constant k accounts for various physical phenomena such as different volume of the solid crystal and the melt. It also includes other variables which are present, and are known to those skilled in the art but not germane to the teaching of the present invention.

Figure 4:
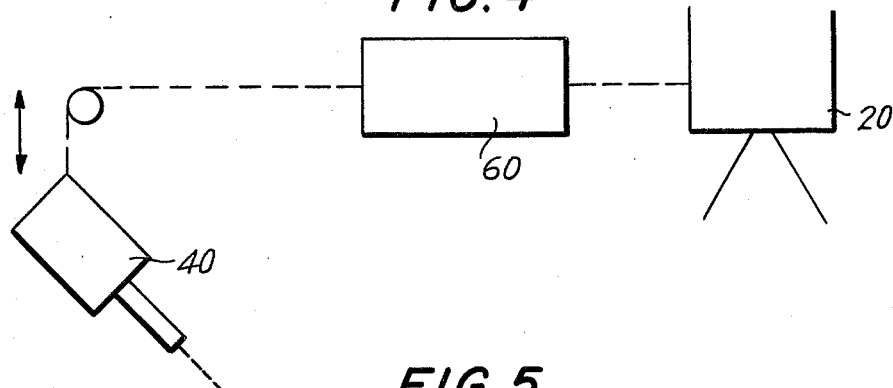
FIGS. 4, 5 and 6 are schematic drawings illustrating three different embodiments of the invention.

Instead of angularly deflecting the pyrometer as shown in FIGS. 1 and 3, the pyrometer can be linearly displaced i.e. moved up or down as the melt level moves up or down. This is shown schematically in FIG. 4.

Figure 5:
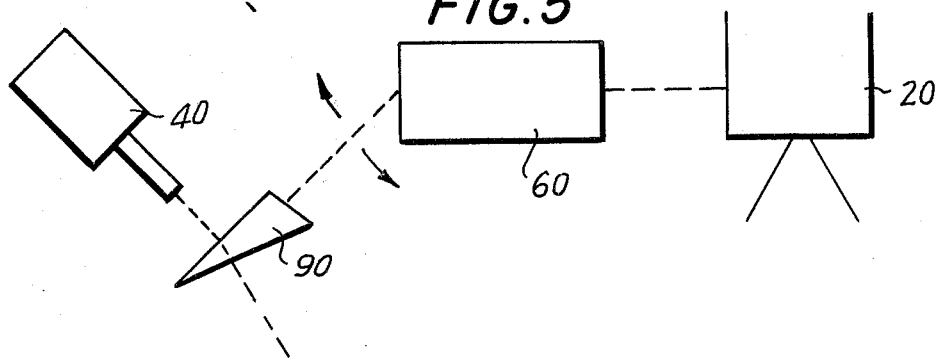

FIG. 5 shows a further embodiment in which the pyrometer is fixed and a prism 90 is included along its sighting path. The prism is rotated or otherwise displaced so that the sighting is adjusted for moving melt level. Alternatively a lens or mirror might be used.

Figure 6:
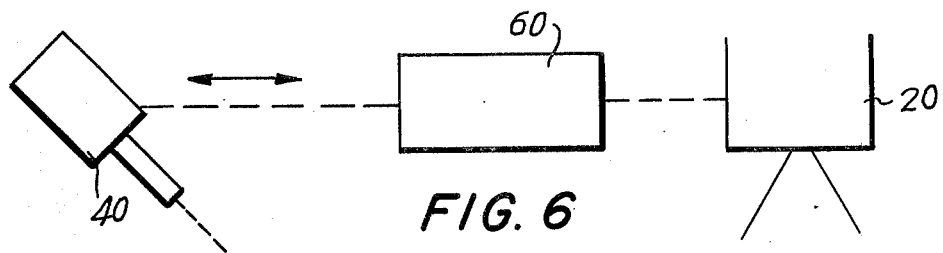

FIG. 6 shows a still further alternative embodiment in which the crystal is displaced horizontally relative to the pyrometer to compensate for moving liquid level. In the exaggerated schematic diagram in this figure the pyrometer and crystal puller are moved as shown by the double-headed arrow to compensate for the falling melt level. Movement may be made either of the pyrometer or of the crystal puller.

The present invention is not limited to crystal growing facilities in which the crucible is raised but will find use in those facilities in which the crucible is fixed and the heater is lowered. Previously cited U.S. Pat. No. 3,337,303 describes such a facility. The basic relation, however, as described in the equation set forth above is still valid, but is changed by substituting heater drop rate for crucible lift rate.

It should be clearly understood that the invention is not limited to crystal pulling facilities having either a crucible lift or heater drop but will find application in other convenient and conventional crystal pulling facilities. For those applications where there is no crucible lift or heater drop the terms are omitted from the relationship. In those situations where the crucible lift or heater drop is not slaved with the crystal puller then the instantaneous velocities of the puller and the crucible lifter and/or heater drop integrated over time are used in the basic equation.

It will be appreciated by those skilled in the art that components other than those shown in the figures may be used; for example, stepper motors may be employed, sensing of the crystal being pulled may be taken from the motor 24, the ingot 18, etc. and sensors other than a vane and micro switch may be used, in short any convenient or conventional sensors, components and controls may be used, without departing from the spirit and scope of the present invention as defined in the following claims.

I claim:

1. A control for a machine for pulling a crystal from a melt in a crucible, which includes means for pulling the crystal and heating the melt, and in which the crucible or its heater is vertically moved in accordance with the pull speed comprising:

A. detecting means active along an operative axis to line up with a selected crystal-melt interface position to define a predetermined crystal diameter and for detecting departure of the actual crystal-melt interface from said selected position and providing a signal in response to sensing such departure; said detecting means comprising a pyrometer having a sighting axis inclined with respect to the axis of the crystal being pulled;
   B. means responsive to said signal for adjusting the melt temperature and/or the crystal pull speed to restore said interface to said selected position; and
   C. means responsive to the level of said melt for moving said operative axis as said melt level varies, said axis moving means comprising exclusively means for angularly displacing said sighting axis of said pyrometer; thereby to produce a crystal of substantially uniform diameter.

2. The control of claim 1, in which said axis moving means moves said axis of said detecting means in accordance with the crystal pull speed, the diameter of the crystal, the inside diameter of the crucible, and the movement rate of the crucible or the heater.

3. The control of claim 1, in which said axis moving means moves said axis of said detecting means in accordance with the crystal pull speed modified in accordance with the ratio of the diameters of the crystal and the crucible respectively.

4. The control of claim 1, in which said axis moving means moves said axis of said detecting means in accordance with the crystal pull speed modified in accordance with the ratio of pull speed and crucible or heater movement speed respectively.

5. The control of claim 1, in which said axis moving means moves said axis of said detecting means in accordance with the velocity of said melt level as determined by the following equation:

$$Vm = k \left(\frac{rx}{rc}\right)^2 (Vc - Vx) + Vc$$

where
   $Vm$ = velocity of the melt level
   $Vx$ = pull rate of the crystal
   $rx$ = the radius of the crystal being pulled
   $rc$ = the internal radius of the crucible
   $Vc$ = the movement rate of the crucible-heater
   $k$ = a factor 6. The control of claim 5, in which the crucible or heater movement and the crystal pulling are slaved together, and the axis moving means includes sensor means for detecting the pull rate of the crystal and for providing a signal in accordance therewith to move said axis.

7. The control of claim 1, in which said axis moving means comprises at least one adjustable optical member in the sighting path of said pyrometer, said optical member being effective to change the orientation of at least a portion of said Sighting Axis.

8. The control of claim 1, in which said axis moving means comprises means operatively connected to said pyrometer for pivoting the latter.

9. A control for a machine for pulling a crystal from a melt in a crucible, which includes means for pulling the crystal and heating the melt, said crystal pulling means including a rotating member, and in which the crucible or its heater is vertically moved in accordance with the pull speed comprising:
- A. detecting means active along an operative axis to line up with a selected crystal-melt interface position to define a predetermined crystal diameter and for detecting departure of the actual crystal-melt interface from said selected position and providing a signal in response to sensing such departure; said detecting means comprising a pyrometer having a sighting axis inclined with respect to the axis of the crystal being pulled;
- B. means responsive to said signal for adjusting the melt temperature and/or the crystal pull speed to restore said interface to said selected position; and
- C. means responsive to the level of said melt for moving said operative axis as said melt level varies, said axis moving means comprising at least one vane mounted on said rotating member, switch means having a mechanical input activated by said vane and providing an electrical output signal in accordance with said activation, an electrical energy control circuit connected to the output of said switch and providing a predetermined quantity of electrical energy in accordance with a signal received from said switch, and drive means connected to receive said electric energy and having a mechanical output operatively connected to said pyrometer exclusively for angularly displacing said sighting axis of said pyrometer.

10. A system comprising a charge in a crucible; a heater for maintaining said charge in a liquid phase; means for drawing a solid crystal from said charge whereby the liquid level in said crucible drops during the drawing of said crystal; means for maintaining the diameter of said crystal substantially constant by observing the solid liquid interface, and controlling at least the drawing rate of the crystal from the liquid charge in accordance therewith; means for pivoting said maintaining means to accommodate for variations in the level of the liquid charge in the crucible in accordance with the ratio of the crystal diameter to the inside crucible diameter, and the ratio of the crystal draw rate to the rate of said crucible or said heater movement.

11. A control for a machine for pulling a crystal from a melt in a crucible, which includes means for pulling the crystal and heating the melt, said crystal pulling means including a rotating member, and in which the crucible or its heater is vertically moved in accordance with the pull speed comprising:
- A. detecting means active along an operative axis to line up with a selected crystal-melt interface position to define a predetermined crystal diameter and for detecting departure of the actual crystal-melt interface from said selected position and providing a signal in response to sensing such departure said detecting means comprising a pyrometer having a sighting axis inclined with respect to the axis of the crystal being pulled;
- B. means responsive to said signal for adjusting the melt temperature and/or the crystal pull speed to restore said interface to said selected position; and
- C. means responsive to the level of said melt for moving said operative axis as said melt level varies, said axis moving means comprising at least one vane mounted on said rotating member, switch means having a mechanical input activated by said vane and providing an electrical output signal in accordance with said activation, an electrical energy control circuit connected to the output of said switch and providing a predetermined quantity of electrical energy in accordance with a signal received from said switch, and drive means connected to receive said electrical energy and having a mechanical output operatively connected to said pyrometer for angularly displacing said sighting axis of said pyrometer.

* * * * *